(12) United States Patent
Laturell et al.

(10) Patent No.: US 9,078,352 B2
(45) Date of Patent: Jul. 7, 2015

(54) LOW INDUCTANCE FLEX BOND WITH LOW THERMAL RESISTANCE

(71) Applicant: LSI Corporation, Milpitas, CA (US)

(72) Inventors: Donald R. Laturell, Oak Hill, FL (US); Said E. Abdelli, Minneapolis, MN (US); Peter Kiss, Basking Ridge, NJ (US); James F. MacDonald, Stillwater, MN (US); Ross S. Wilson, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 229 days.

(21) Appl. No.: 13/662,659

(22) Filed: Oct. 29, 2012

(65) Prior Publication Data

US 2014/0118966 A1 May 1, 2014

(51) Int. Cl.
| | |
|---|---|
| H05K 1/00 | (2006.01) |
| H05K 3/30 | (2006.01) |
| H05K 1/02 | (2006.01) |
| H01L 23/498 | (2006.01) |
| H05K 3/46 | (2006.01) |

(52) U.S. Cl.
CPC ............ *H05K 1/0216* (2013.01); *Y10T 29/4913* (2015.01); *H05K 1/028* (2013.01); *H05K 3/4691* (2013.01); *H05K 2201/042* (2013.01); *H01L 23/4985* (2013.01); *H05K 3/306* (2013.01); *H01L 2224/48472* (2013.01); *H01L 2224/49111* (2013.01); *H01L 2224/49175* (2013.01); *H01L 2924/30107* (2013.01); *H01L 2924/3011* (2013.01)

(58) Field of Classification Search
CPC  H05K 2201/042; H05K 1/028; H05K 3/4691
USPC .............................................. 361/749; 29/832
See application file for complete search history.

(56) References Cited

U.S. PATENT DOCUMENTS

| | | | | |
|---|---|---|---|---|
| 4,687,695 | A * | 8/1987 | Hamby | 428/192 |
| 4,755,783 | A * | 7/1988 | Fleischer et al. | 336/84 C |
| 4,783,695 | A * | 11/1988 | Eichelberger et al. | 257/668 |
| 4,918,811 | A * | 4/1990 | Eichelberger et al. | 438/107 |
| 5,198,965 | A * | 3/1993 | Curtis et al. | 361/717 |
| 5,419,038 | A * | 5/1995 | Wang et al. | 29/830 |
| 5,742,484 | A * | 4/1998 | Gillette et al. | 361/789 |
| 6,603,079 | B2 * | 8/2003 | Biron | 174/254 |
| 6,985,659 | B2 * | 1/2006 | Torigoe et al. | 385/114 |
| 7,388,756 | B1 * | 6/2008 | Worl et al. | 361/760 |
| 7,649,245 | B2 * | 1/2010 | Zingher et al. | 257/664 |

(Continued)

*Primary Examiner* — Jeremy C Norris
*Assistant Examiner* — Nathan Milakovich
(74) *Attorney, Agent, or Firm* — Suiter Swantz pc llo

(57) ABSTRACT

A electronic circuit with low inductance connections is disclosed. The electronic circuit includes a ground plane and a flex circuit. The flex circuit having a first surface generally facing the ground plane and a second surface opposite to the first surface. The flex circuit also having a flexible bridge defined thereof. The electronic circuit further includes a first electronic device communicatively coupled to the second surface of the flex circuit, a second electronic device communicatively coupled to the second surface of the flex circuit, and at least one conductive trace defined on the second surface of the flex circuit and extending along the flexible bridge. One end of the at least one conductive trace is configured for receiving an outbound current from the first electronic device and another end of the at least one conductive trace is communicatively coupled to the second electronic device through a vertical interconnect access.

14 Claims, 6 Drawing Sheets

(56) References Cited

U.S. PATENT DOCUMENTS

| | | | |
|---|---|---|---|
| 7,671,449 B2* | 3/2010 | Zingher et al. | 257/664 |
| 7,838,409 B2* | 11/2010 | Zingher et al. | 438/599 |
| 8,508,947 B2* | 8/2013 | Ganesan et al. | 361/749 |
| 2006/0095639 A1* | 5/2006 | Guenin et al. | 710/310 |
| 2006/0223227 A1* | 10/2006 | Kubota et al. | 438/106 |
| 2008/0225476 A1* | 9/2008 | Karabatsos | 361/684 |
| 2009/0000809 A1* | 1/2009 | Yagisawa et al. | 174/254 |
| 2009/0084583 A1* | 4/2009 | Ueno | 174/254 |
| 2011/0075384 A1* | 3/2011 | Yeates | 361/752 |
| 2013/0249740 A1* | 9/2013 | Shedletsky | 343/700 MS |
| 2014/0268780 A1* | 9/2014 | Wang et al. | 362/249.06 |
| 2014/0354900 A1* | 12/2014 | Qian et al. | 349/12 |

* cited by examiner

LOW INDUCTANCE FLEX BOND WITH LOW THERMAL RESISTANCE

TECHNICAL FIELD

The present invention relates to the field of wire bonding techniques and particularly to a method for providing low inductance connections to transistors and other devices in an electronic circuit.

BACKGROUND

Wire bonding is a method of making interconnections between an integrated circuit (IC) and a printed circuit board (PCB) during semiconductor device fabrication. Inductance is a property of a conductor by which a change in current in the conductor induces a voltage in both the conductor itself (self-inductance) and the nearby conductors (mutual inductance). It has been found that the self inductance of the bonding wires and the mutual inductance between bonding wires are significant and can limit the electrical performance of an electronic/integrated circuit. Therein lies the need to provide a method for providing low inductance connections to transistors and other devices in an electronic circuit.

SUMMARY

Accordingly, an embodiment of the present disclosure is directed to a electronic circuit. The electronic circuit includes a ground plane and a flex circuit. The flex circuit having a first surface generally facing the ground plane and a second surface opposite to the first surface. The flex circuit also having a flexible bridge defined thereof. The electronic circuit further includes a first electronic device communicatively coupled to the second surface of the flex circuit, a second electronic device communicatively coupled to the second surface of the flex circuit, and at least one conductive trace defined on the second surface of the flex circuit and extending along the flexible bridge. One end of the at least one conductive trace is configured for receiving an outbound current from the first electronic device and another end of the at least one conductive trace is communicatively coupled to the second electronic device through a vertical interconnect access (via).

A further embodiment of the present disclosure is directed to a method for reducing inductance in an electronic circuit. The method includes: connecting a first electronic device to a surface of a flex circuit; connecting a second electronic device to said surface of the flex circuit; providing at least one conductive trace on said surface of the flex circuit, the at least one conductive trace configured for connecting an outbound current from the first electronic device to the second electronic device, wherein one end of the at least one conductive trace is configured for receiving the outbound current from the first electronic device and another end of the at least one conductive trace is communicatively coupled to the second electronic device through a vertical interconnect access (via); and providing a continuous layer of conductive material on an opposite surface of the flex circuit, allowing the at least one conductive trace to follow a same path as a return current on the opposite surface of the flex circuit.

An additional embodiment of the present disclosure is directed to a method for manufacturing an electronic circuit. The method includes: securing at least a portion of a flex circuit to a ground plane, the flex circuit having a first surface generally facing the ground plane and a second surface opposite to the first surface, the flex circuit including at least one conductive trace defined on the second surface of the flex circuit and extending along a flexible bridge; communicatively coupling a first electronic device to the second surface of the flex circuit within the portion of the flex circuit secured to the ground plane; pulling the flexible bridge towards the first electronic device and communicatively coupling one end of the at least one conductive trace to the first electronic device through a vertical interconnect access (via); securing a remaining portion of the flex circuit to the ground plane; and communicatively coupling a second electronic device to the second surface of the flex circuit, wherein another end of the at least one conductive trace is configured for receiving an outbound current from the second electronic device.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Figure 1:
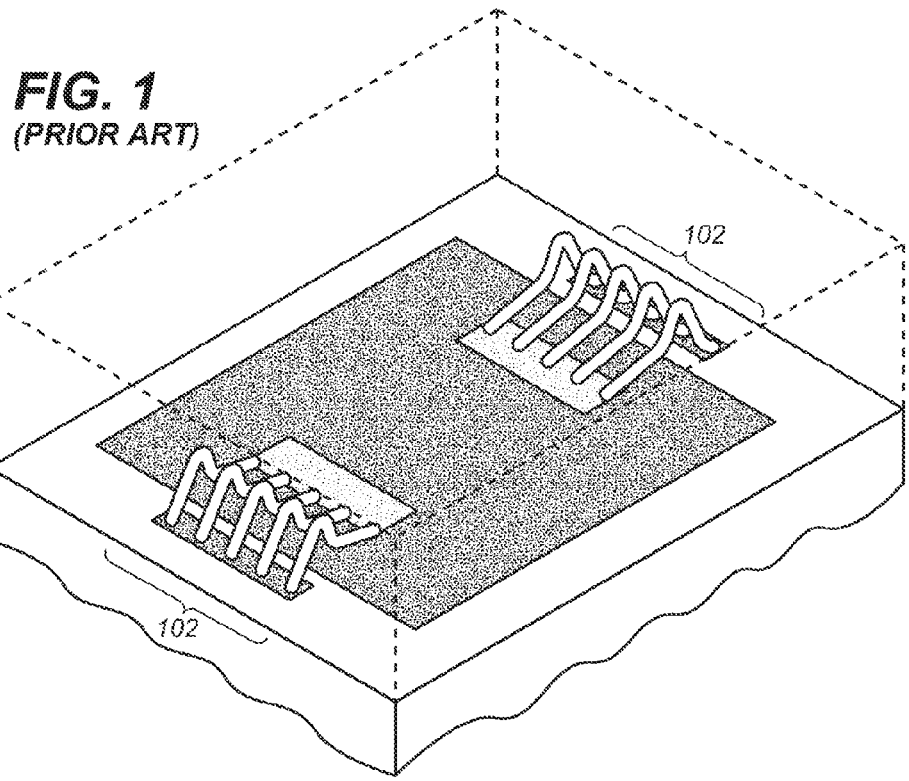
FIG. 1 is an isometric view depicting a conventional wire bond technique.

Conventional wire bond techniques use multiple bonds in an attempt to lower inductance. FIG. 1 is an illustration depicting a conventional wire bond technique. Wire bonds have inductance that limits the bandwidth of many designs. There is an opportunity to limit inductance, however, it requires placement of a similar wire bond with current flowing in the opposite direction of the original signal. This opposite current flow is not practical in many instances including the example bonding depicted in FIG. 1. More specifically, studies indicate that the mutual inductance between the parallel wire bonds 102 configured according to a conventional wire bond technique is greater than their ability to cancel the inductance. That is, the mutual inductance between the parallel wire bonds 102 limits the total possible reduction in the inductance.

Figure 2:
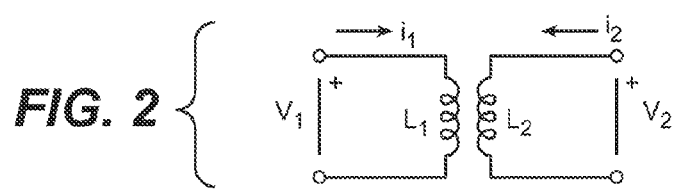
FIG. 2 is a circuit diagram depicting a transformer circuit.

The equations governing this inductance reduction are given below. Referring to the transformer circuit depicted in FIG. 2, the transformer equations are defined as follows:

$$\begin{cases} v_1 = jL_1\omega i_1 + jM\omega i_2 \\ v_2 = jM\omega i_1 + jL_2\omega i_2 \end{cases}$$
$$\text{where } M = k\sqrt{L_1 L_2}.$$

In the equation above, M represents the mutual inductance, $L_1$ and $L_2$ represent the self-inductances of the conductors, respectively, and k is a factor representing the distance between the two conductors.

In a conventional parallel wire bond configuration, $L_1=L_2$ and $v_1=v_2$ implies $i_1=i_2$. The following equations can be derived from the transformer equations:

$$\begin{cases} v_1 = jL\omega i_1 + jkL\omega i_2 \\ v_2 = jkL\omega i_1 + jL\omega i_2 \end{cases} \Rightarrow \begin{cases} Z_1 = jL(1+k)\omega \\ Z_2 = jL(1+k)\omega \end{cases}$$

Based on the equations above, the total impedance of the circuit is calculated as $$Z_{eq} = \frac{L}{2}(1+k)\omega \text{ for } Z_1 // Z_2.$$

Figure 3:
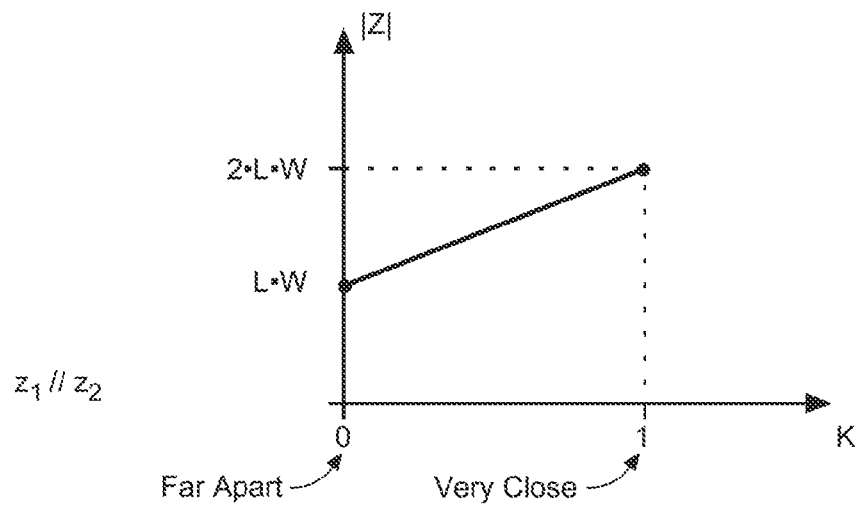
FIG. 3 is an illustration depicting the relationship between impedance and the distance between a pair of parallel wires in a conventional parallel wire bond configuration.

The graphical representation of the impedance with respect to k is depicted in FIG. 3. As the figure indicates, when k is approaching 0 (i.e., the two conductors are far apart), $Z_1=Z_2=L\omega$, and $$Z_{eq} = \frac{L\omega}{2}.$$

However, as k approaches 1 (i.e., the two conductors are very close to each other), $Z_1=Z_2=2L\omega$, and $Z_{eq}=L\omega$. The result demonstrates that the mutual inductance between the parallel wire bonds limits the total possible reduction in the inductance. That is, conventional parallel wire bond configurations are not effective in reducing the inductance.

The present disclosure is directed to a method for providing low inductance connections to transistors and other electrical components/devices in an electronic circuit. In accordance with the present disclosure, the wires/conductors are configured in an antiparallel manner that provides opposite current flow in order to reduce inductance. That is, the conductors located on one side (e.g., the top side) of the circuit follow the same path as the return current on the opposite side (e.g., the bottom side), thus $i_1=-i_2$ and $L_1=L_2$. The following equations can be derived from the transformer equations:

$$\begin{cases} v_1 = (jL\omega - jM\omega)i_1 \\ v_2 = (jL\omega - jM\omega)i_2 \end{cases} \Rightarrow \begin{cases} Z_1 = jL(1-k)\omega \\ Z_2 = jL(1-k)\omega \end{cases}$$

Figure 4:
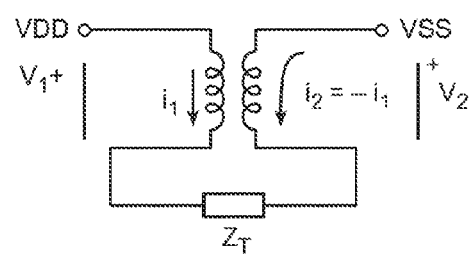
FIG. 4 is a circuit diagram depicting wires in an antiparallel configuration.

Referring now to FIG. 4, two conductors configured in an antiparallel manner is shown. For simplicity of the discussion, assuming $Z_T=0$, the following equations can be derived:

$$v_{DD} - v_{SS} = v_1 - v_2$$
$$i_{in} = i_1 = -i_2$$
$$Z_{in} = \frac{v_1 - v_2}{i_1} = \frac{v_1}{i_1} - \frac{v_2}{i_1} = \frac{v_1}{i_1} + \frac{v_2}{i_2} = 2Z_1 = 2jL(1-k)\omega$$

Figure 5:
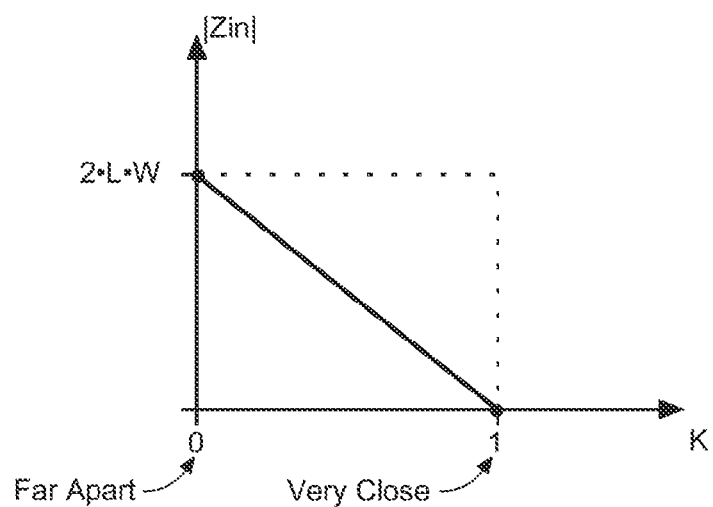
FIG. 5 is an illustration depicting the relationship between impedance and the distance between a pair of parallel wires in an antiparallel configuration.

The graphical representation of the impedance with respect to k when the wires are configured in an antiparallel manner is depicted in FIG. 5. As indicated in FIG. 5, when k is approaching 0 (i.e., the two conductors are far apart), $|Z_{in}|=2L\omega$. However, as k approaches 1 (i.e., the two conductors are very close to each other), $|Z_{in}|$ approaches 0. That is, the wires configured in an antiparallel manner can reduce inductance further without the aforementioned limitations associated with a conventional parallel wire bond configuration. Furthermore, even if $Z_T \neq 0$, the impedance can be calculated as $Z_{in}=2Z_1+Z_T$, which still indicates that $|Z_{in}|$ can be reduced as the coupling between the two conductors increases (i.e., get closer to each other).

The method and the electronic circuit produced in accordance with the present disclosure take advantage of the inductance reduction rules described above. More specifically, the method and the electronic circuit produced in accordance with the present disclosure uses a flex circuit to increase the coupling between the signal plane and the image plane. Furthermore, using the flex circuit in the manner in accordance with the present disclosure allows the conductors located on one surface (e.g., the top surface) of the flex circuit to follow the same path as the return current on the opposite surface (e.g., the bottom surface), therefore reducing inductance as described above.

Flex circuits (may also be referred to as flexible electronics) refer to a technology for assembling electronic circuits by mounting electronic devices on flexible substrates, such as polyimide or transparent conductive polyester film or the like. Flex circuits may be manufactured using components that are used for rigid printed circuit boards, allowing the board to conform to a desired shape or to flex during its use.

Figure 6:
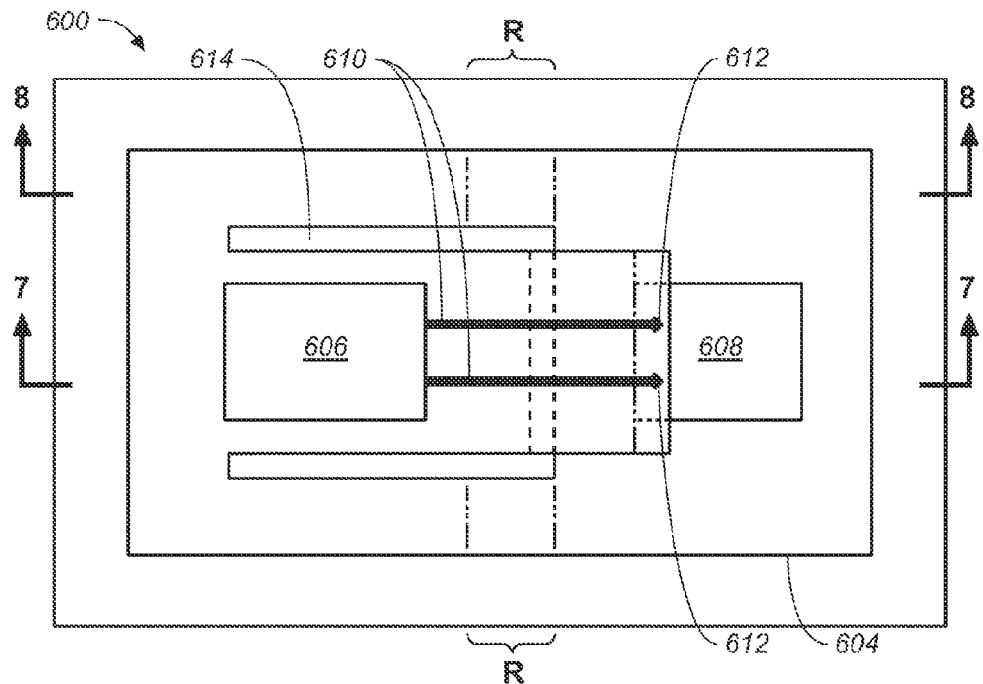
FIG. 6 is a top view of an electronic circuit in accordance with the present disclosure.
Figure 7:
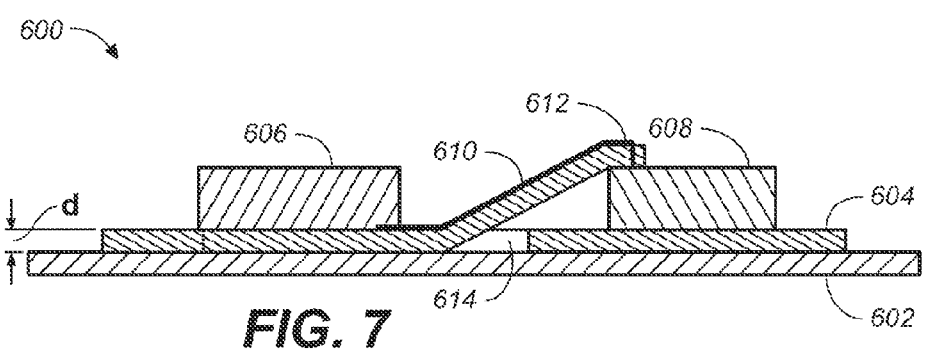
FIG. 7 is a cross-sectional view of the electronic circuit as depicted in FIG. 6.
Figure 8:
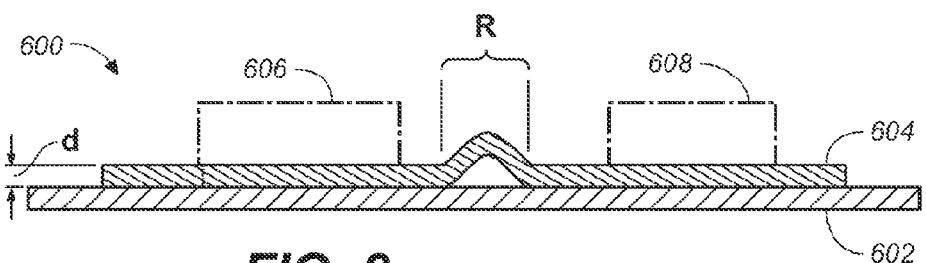
FIG. 8 is another cross-sectional view of the electronic circuit as depicted in FIG. 6.

Referring now to FIGS. 6 through 8, an electronic circuit 600 in accordance with the present disclosure is illustrated. The electronic circuit 600 includes a continuous ground plane 602 (may also be referred to as an image plane). The electronic circuit 600 also includes a flex circuit 604 secured to a surface of the ground plane 602. In the exemplary electronic circuit 600 depicted in the figures, the flex circuit 604 is utilized for connecting the outbound current from a first device 606 to a second device 608.

In one embodiment, the top surface (in the orientation depicted in FIG. 7) of the flex circuit 604 includes one or more signal/conductive traces 610 for connecting the outbound current from the first device 606 to the second device 608. As illustrated in FIG. 7, one end of each signal/conductive trace 610 is configured for receiving an outbound current from the first device 606 and the other end of that signal/conductive trace 610 extends along the bridge and is communicatively coupled to a pad of a via (vertical interconnect access) 612 on the top surface. The opposite pad of the via 612 located on the bottom surface is communicatively coupled to the second device 608, therefore connecting the outbound current from the first device 606 to the second device 608.

The bottom surface of the flex circuit 604, on the other hand, includes a continuous layer of conductive material (e.g., copper or the like) secured to the ground plane 602. In this manner, as long as the outbound current through the top side conductive traces 610 follows the same path as the current in the image plane on the bottom layer, mutual coupling will reduce the series inductance. It is contemplated that while it is not possible to have 0 distance between the top and bottom surfaces, very significant reduction in inductance can be achieved if the distance d between the top and bottom surfaces is sufficiently small so that they are considered closely coupled.

In one embodiment, the distance d between the top and bottom surfaces is considered sufficiently small if d is less than 2 diameters of a round wire/conductor, or less than or equal to the width of a given signal/conductive trace of the flex circuit 604. Alternatively, the distance d between the top and bottom surfaces is considered sufficiently small if the thickness of the flex circuit 604 is less than or equal to approximately 1 mil (i.e., 1/1000 of an inch). It is contemplated, however, that the definitions above are not absolute requirements. A flex circuit that is as thin as practical may be utilized to implement the electronic circuit without departing from the spirit and scope of the present disclosure.

Figure 9:
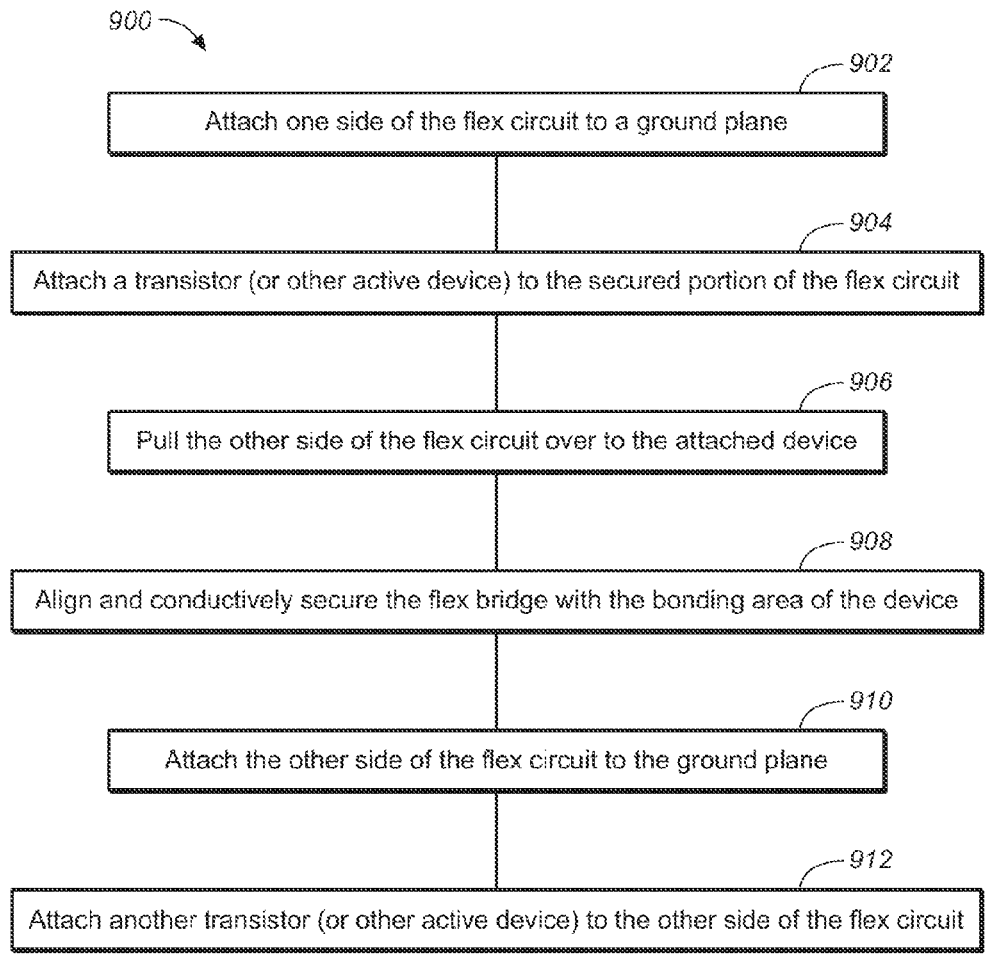
FIG. 9 is a flow diagram depicting a method for producing the electronic circuit as depicted in FIG. 6.
Figure 10:
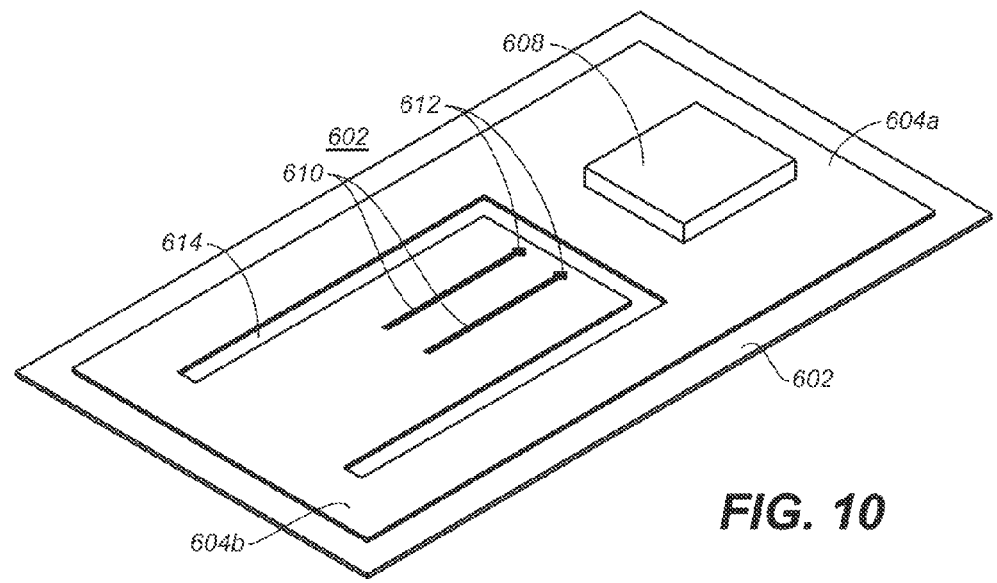
FIG. 10 is an illustration depicting the flex circuit of the electronic circuit at a relaxed state.
Figure 11:
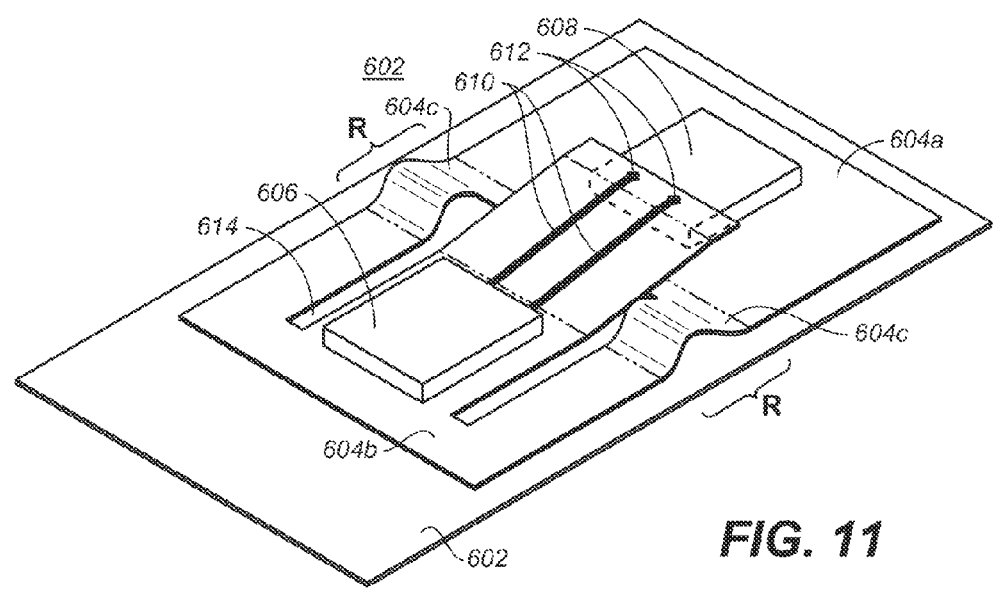
FIG. 11 is an illustration depicting the flex circuit of the electronic circuit at a pulled over state.

It is contemplated that various technologies may be utilized to assemble the electronic circuit 600 described above. For instance, an exemplary pullover technique 900 is depicted in FIGS. 9 through 11. Step 902 first attaches one side of the flex circuit 604 to the ground plane 602. In the orientation depicted in FIG. 10, the right side of the flex circuit 604A is attached to the ground plane 602 first. Step 904 then attaches a transistor (or other active device) 608 to the secured right portion of the flex circuit 604A. Step 906 then pull the left half of the flex circuit 604B over to the right side transistor. More specifically, the flex circuit 604 have a cut slot 614 that defines a flexible bridge for engaging at least a portion of the device 608 when pulled over. Subsequently, step 908 aligns the flex bridge with the bonding area of the device 608 and conductively secures (e.g., applying thermo-compression bonding or the like) the flex bridge with the bonding area of the device 608. The flex bridge conductively secured to the bonding area of the device 608 is depicted in FIG. 11 as well as in the cross-sectional view shown in FIG. 7.

Step 910 then attaches the remaining side of the flex circuit 604 to the ground plane 602. In the current example, the left side of the flex circuit 604B is now attached to the ground plane 602. Step 912 then attaches another transistor (or other active device) 606 to the secured left half portion of the flex circuit 604B. Device 606 is now communicatively coupled to the conductive traces 610 on the top side of the flex circuit 604B, and the conductive traces 610 will now facilitate communication between the devices 606 and 608 as described above.

It is noticed that the electronic circuit assembled in accordance with the pullover technique presented above may contain one or more ripples between the two secured portions 604A and 604B. They are indicated as 604C in FIG. 11 and are also indicated in FIGS. 6 and 8. While these ripples are not directly secured to the ground plane 602, they span only a small portion on a circuit chip and do not negatively impact the operation of the circuit. The advantage of this implementation is that the flex element can be manufactured in one piece. For instance, flex circuits can be die cut to create the desired shape similar to the flex circuits described above. The flexibility of the circuit and the pullover technique allows the creation of an overlap condition to facilitate the communicative coupling between the devices 606 and 608.

Figure 12A:
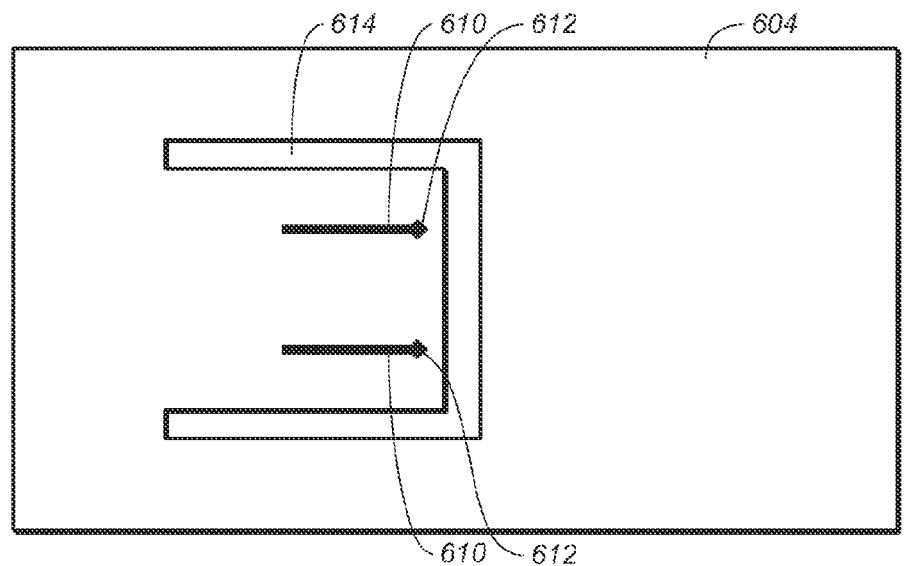
FIG. 12A is a top view of an exemplary flex circuit in accordance with the present disclosure.
Figure 12B:
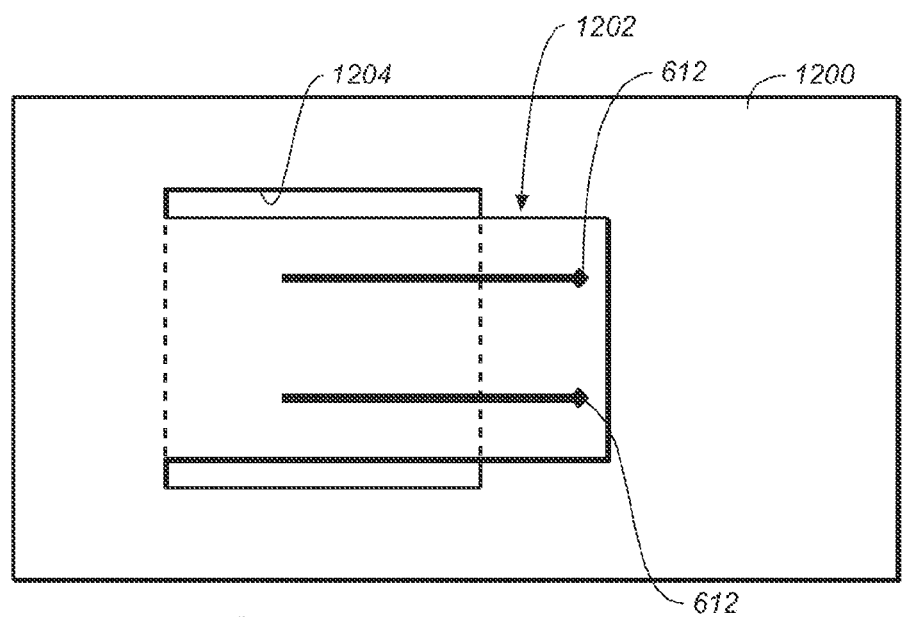
FIG. 12B is a top view of an alternative flex circuit in accordance with the present disclosure.

However, it is contemplated that the pullover technique is not required to create the overlap condition. For instance, if the substrate to which the flex circuit is exposed, (e.g., when left half of the flex bond area is lifted) and a second active device is placed in the exposed area, a similar overlap area is created with the same low inductance. Alternatively, as shown in FIG. 12, the bridge 1202 of the flex circuit 1200 is configured to extend beyond the cut slot 1204 into the right side of the flex circuit. In this manner, the flex bridge is aligned with the bonding area of the device located on the right side of the flex circuit without having to perform the pullover and therefore avoid creating ripples. It is contemplated that various other techniques may also be utilized to create the overlap condition as described above without departing from the spirit and scope of the present disclosure.

It is contemplated that the devices 606 and 608 referenced in the examples above may include various types of electronic devices/components that are used for producing electronic circuits. Such devices may include, but not limited to, flip chips, transistors, as well as other semiconductor devices and the like. Furthermore, it is understood that the depictions of the exemplary flex circuits 604 and 1200 are simplified for illustrative purposes. The flex circuits may include other circuitry components in addition to the one or more signal/conductive traces 610 depicted in the figures without departing from the spirit and scope of the present disclosure.

It is also contemplated that allowing thermo-compression bonding to conductively secure a flex bridge and the bonding area of a device may be appreciated, especially for high speed circuits. A further advantage of the electronic circuit produced in accordance with the present disclosure is that the circuit layout maintains a low thermal resistance that is consistent with low inductance (e.g., with a range (Tj) of 0.5° C. to 1° C. per Watt). For instance, the flex circuit may provide one or more vias (e.g., copper vias) under devices 606 and/or 608 to serve as heat pipes. Such a configuration provides improved heat dissipation and may be appreciated in various operating conditions/environments.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An electronic circuit, comprising:
   a ground plane;
   a flex circuit, the flex circuit having a first surface generally facing the ground plane and a second surface opposite to the first surface, the flex circuit defining a flexible bridge at least partially split from the rest of the flex circuit;
   a first electronic device positioned on the second surface of the flex circuit;

a second electronic device positioned on the second surface of the flex circuit; and at least one conductive trace defined on the second surface of the flex circuit and extending along the flexible bridge, one end of the at least one conductive trace being configured for receiving an outbound current from the first electronic device and another end of the at least one conductive trace being communicatively coupled to at least one electrical contact of the second electronic device through a vertical interconnect access (via), wherein the at least one electrical contact of the second electronic device is located away from the second surface of the flex circuit.

2. The electronic circuit of claim 1, wherein the at least one conductive trace comprises a round wire, and wherein a distance between the first and second surfaces of the flex circuit is less than twice a diameter of the round wire.

3. The electronic circuit of claim 1, wherein a distance between the first and second surfaces of the flex circuit is less than or equal to the width of the at least one conductive trace.

4. The electronic circuit of claim 1, wherein a distance between the first and second surfaces of the flex circuit is less than or equal to approximately 1 mil.

5. The electronic circuit of claim 1, wherein the first surface of the flex circuit includes a continuous layer of conductive material.

6. The electronic circuit of claim 1, wherein the first and second electronic devices each includes at least one of a chip or a transistor.

7. The electronic circuit of claim 1, further comprising:
a plurality of copper vias defined within the flex circuit and function as heat pipes.

8. An apparatus, comprising:
an electronic circuit, the electronic circuit comprising:
a ground plane;
a flex circuit, the flex circuit having a first surface generally facing the ground plane and a second surface opposite to the first surface, the flex circuit defining a flexible bridge at least partially split from the rest of the flex circuit;
a first electronic device positioned on the second surface of the flex circuit;
a second electronic device positioned on the second surface of the flex circuit; and
at least one conductive trace defined on the second surface of the flex circuit and extending along the flexible bridge, one end of the at least one conductive trace being configured for receiving an outbound current from the first electronic device and another end of the at least one conductive trace being communicatively coupled to at least one electrical contact of the second electronic device through a vertical interconnect access (via), wherein the at least one electrical contact of the second electronic device is located away from the second surface of the flex circuit.

9. The apparatus of claim 8, wherein the at least one conductive trace comprises a round wire, and wherein a distance between the first and second surfaces of the flex circuit is less than twice a diameter of the round wire.

10. The apparatus of claim 8, wherein a distance between the first and second surfaces of the flex circuit is less than or equal to the width of the at least one conductive trace.

11. The apparatus of claim 8, wherein a distance between the first and second surfaces of the flex circuit is less than or equal to approximately 1 mil.

12. The apparatus of claim 8, wherein the first surface of the flex circuit includes a continuous layer of conductive material.

13. The apparatus of claim 8, wherein the first and second electronic devices each includes at least one of a chip or a transistor.

14. The apparatus of claim 8, wherein electronic circuit further comprises:
a plurality of copper vias defined within the flex circuit and function as heat pipes.

* * * * *